(12) United States Patent
He et al.

(10) Patent No.: US 11,544,917 B2
(45) Date of Patent: Jan. 3, 2023

(54) POWER ELECTRONIC CIRCUIT FAULT DIAGNOSIS METHOD BASED ON OPTIMIZING DEEP BELIEF NETWORK

(71) Applicant: WUHAN UNIVERSITY, Hubei (CN)

(72) Inventors: Yigang He, Hubei (CN); Bolun Du, Hubei (CN); Yaru Zhang, Hubei (CN); Jiajun Duan, Hubei (CN); Liulu He, Hubei (CN); Kaipei Liu, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 547 days.

(21) Appl. No.: 16/676,387

(22) Filed: Nov. 6, 2019

(65) Prior Publication Data

US 2020/0285900 A1 Sep. 10, 2020

(30) Foreign Application Priority Data

Mar. 6, 2019 (CN) .......................... 201910169327.4

(51) Int. Cl.
| | |
|---|---|
| *G06V 10/774* | (2022.01) |
| *G06K 9/62* | (2022.01) |
| *G06F 17/11* | (2006.01) |
| *G06N 3/04* | (2006.01) |
| *G06N 3/08* | (2006.01) |

(52) U.S. Cl.
CPC .......... *G06V 10/7747* (2022.01); *G06F 17/11* (2013.01); *G06K 9/6257* (2013.01); *G06K 9/6259* (2013.01); *G06N 3/04* (2013.01); *G06N 3/08* (2013.01); *G06V 10/7753* (2022.01)

(58) Field of Classification Search
CPC .. G06V 10/98; G06V 10/993; G06V 10/7747; G06V 10/7753; G06F 17/11; G06N 3/08; G06N 3/04
See application file for complete search history.

(56) References Cited

PUBLICATIONS

A publication to: Xu, et al. (Open-Circuit fault diagnosis of Power Rectifier Using Sparse Autoencoder Based Deep Neural Network), pp. 1-10, (Year: 2018).*
Zhao, et al. (Research Advances in Fault Diagnosis and Prognostic based on Deep Learning), 1-6, (Year: 2016).*

* cited by examiner

*Primary Examiner* — Daniel G Mariam
(74) *Attorney, Agent, or Firm* — JCIPRNET

(57) ABSTRACT

A fault diagnosis method for power electronic circuits based on optimizing a deep belief network, including steps. (1) Use RT-LAB hardware-in-the-loop simulator to set up fault experiments and collect DC-link output voltage signals in different fault types. (2) Use empirical mode decomposition to extract the intrinsic function components of the output voltage signal and its envelope spectrum and calculate various statistical features to construct the original fault feature data set. (3) Based on the feature selection method of extreme learning machine, remove the redundancy and interference features, as fault sensitive feature data set. (4) Divide the fault sensitive feature set into training samples and test samples, and primitively determine the structure of the deep belief network. (5) Use the crow search algorithm to optimize the deep belief network. (6) Obtain the fault diagnosis result.

8 Claims, 6 Drawing Sheets

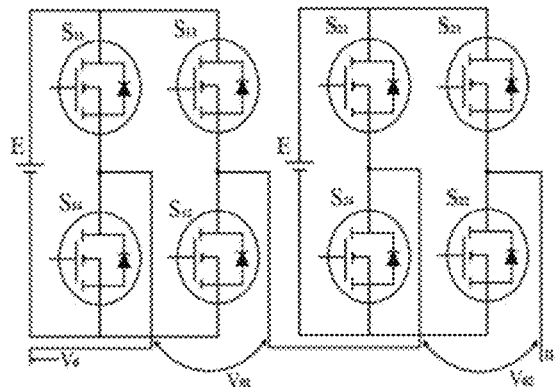
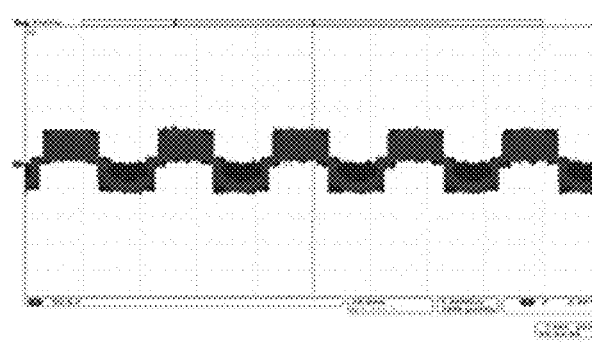
FIG. 2C
FIG. 2A
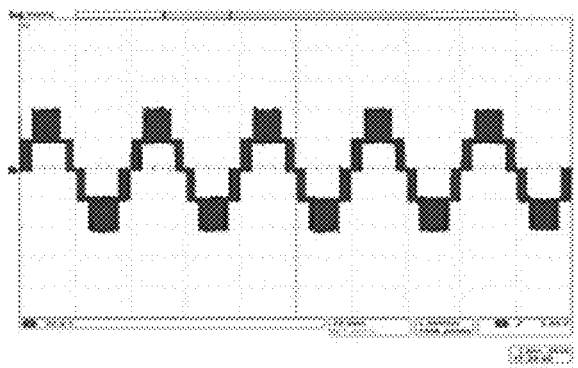
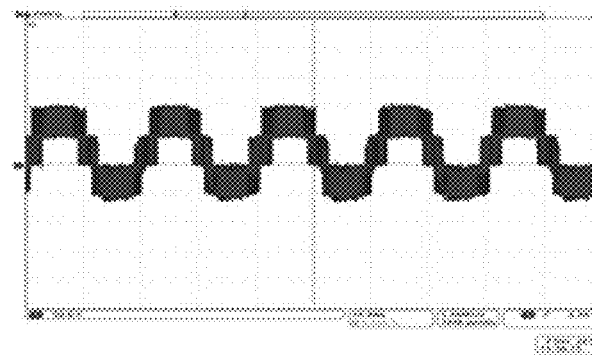
FIG. 2D
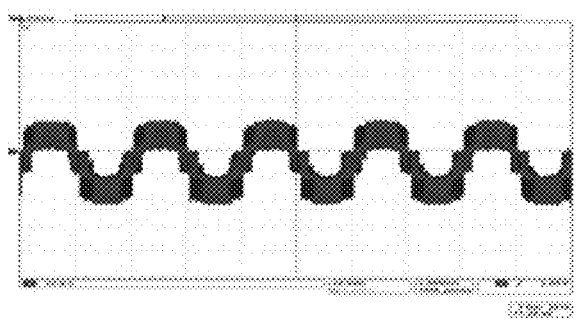
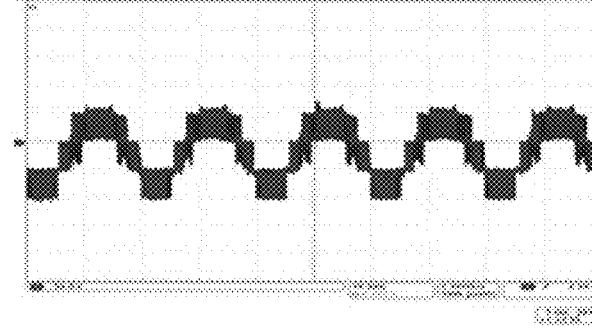
FIG. 2B
FIG. 2E Normal $S_{11}$ open circuit fault $S_{12}$ open circuit fault $S_{13}$ open circuit fault $S_{14}$ open circuit fault $S_{21}$ open circuit fault $S_{22}$ open circuit fault $S_{23}$ open circuit fault $S_{24}$ open circuit fault

POWER ELECTRONIC CIRCUIT FAULT DIAGNOSIS METHOD BASED ON OPTIMIZING DEEP BELIEF NETWORK

CROSS-REFERENCE TO RELATED APPLICATION

This application claims the priority benefit of China application serial no. 201910169327.4, filed on Mar. 6, 2019. The entirety of the above-mentioned patent application is hereby incorporated by reference herein and made a part of this specification.

BACKGROUND

Technical Field

The disclosure belongs to the field of power electronic circuit fault diagnosis, and particularly relates to a power electronic circuit fault diagnosis method based on optimized deep belief network.

Description of Related Art

The reliability of power electronic converter system is of paramount importance in energy, transportation, communications, industrial manufacturing, aerospace, environmental protection and defense military applications.

The fault diagnosis of power electronic converter system is mainly for monitoring and diagnosis of power electronic devices in its main circuit. Currently, power electronic fault diagnosis methods are mainly divided into three categories: analytical model method, signal identification method and knowledge fusion method. The analytical model fault diagnosis method needs to accurately establish the fault model of the circuit. The common signal identification methods include Fourier transform, Park transform and wavelet transform, but these methods may lead to loss of effective fault information in the signal processing process. When there are multiple fault types, the fault feature selected after the transformation cannot effectively distinguish different fault types. The knowledge fusion fault diagnosis method, such as artificial neural network method identification method is likely to fall into the locally optimal solution during training, and it has great blindness in selecting the initial connection weights and thresholds. It is difficult to adjust parameters and select a fault feature vector. The disclosure solves the above shortcomings and improves the fault diagnosis accuracy of power electronic circuit.

SUMMARY

The technical problem to be solved by the present disclosure is to provide a power electronic circuit fault diagnosis method based on an optimized deep belief network. To avoid the shortcomings of neural network over-learning and falling into local minimum, increase the number of power electronic circuit fault feature and improve the fault diagnosis accuracy of power electronic circuit.

The technical solution adopted by the present disclosure to solve the above technical problem is a power electronic circuit fault diagnosis method based on an optimized deep belief network, including the following steps.

(1) Use MATLAB/Simulink to establish the circuit topology and controller simulation model, and perform a real-time operation of the controller simulation model through a RT-LAB hardware-in-the-loop simulator to complete the system design; set up the fault experiment and collect DC-link output voltage signal of power electronic circuits in different fault types as a raw data set; obtain original fault feature by label classifying fault types according to numbers and positions of faulty power electronic devices.

(2) Perform empirical mode decomposition (EMD) on DC-link output voltage signal, obtain the effective intrinsic mode function (IMF) component, and calculate statistical features to construct the original fault feature data set.

(3) Select a fault sensitive feature data set based on the feature selection method of extreme learning machine (ELM) by removing the redundancy and interference features in the original fault feature data set and normalize the original fault feature data set (the dimensional relationship between variables is eliminated, so that the data is comparable).

(4) Divide the fault sensitive feature data set into training samples and test samples, and primitively determine the structure of the deep belief network (DBN).

(5) Use a crow search algorithm (CSA) to optimize the network structure of the DBN, determine number of neurons in the first and second hidden layers on the training sample, and set the nodes number of the input layer, the hidden layer and the output layer in DBN.

(6) Use a CSA-DBN fault diagnosis classifier to identify different fault type of the power electronic circuit test samples, calculate a classification accuracy, and providing the fault diagnosis result.

According to the above scheme, the specific method for setting the fault experiment using the RT-LAB hardware-in-the-loop simulator in the step (1) is as follows.

Develop a control strategy by connecting the real DSP control platform to the RT-LAB hardware-in-the-loop simulator.

Set different fault experiments by using the RT-LAB hardware-in-the-loop simulator; construct a fault feature database containing multiple fault types such as open circuit or short circuit fault, and record the information of fault location, fault type, fault cause, fault effect, and a circuit system output voltage.

Collect the output voltage signal of the power electronic circuit, set different fault types, and develop research on fault feature extraction, fault feature optimization and fault diagnosis algorithms.

According to the above scheme, the specific method for obtaining the original fault feature by EMD in the step (2) is as follows: performing the EMD on the output voltage signal of each fault types; obtaining effective first 7-order of IMF components; and calculating signal sequences of 10 statistical features for the each order IMF components, including: IMF component, energy entropy of the IMF component, mean, standard deviation, skewness, kurtosis, wave index, margin index, peak index, and amplitude; in each of the fault type, the corresponding first 7-order IMF components have 70 statistical feature parameters in total, as the original fault feature data set.

According to the above scheme, the specific method of the step (3) is as follows: filtering the data of the original fault feature data set based on ELM feature selection method; reducing a dimension of the fault feature; and taking top 30 fault feature signal sequences with a highest weight among all fault feature signal sequences, as the fault sensitive feature data set.

According to the above scheme, the specific method of the step (4) is as follows.

Divide the fault sensitive feature data set into training samples and test samples. The DBN consists of 3 deep Boltzmann machines (RBMs), a first layer (input layer) and the second layer of DBN are the visible layer and the hidden layer of a RBM1, respectively. The first layer of DBN is the data input layer. The second layer of the DBN and the third layer of the DBN are respectively the visible layer and the hidden layer of a RBM2. The third layer of the DBN and the fourth layer of the DBN are respectively the visible layer and the hidden layer of a RBM3.

According to the above scheme, the specific method of the step (5) is as follows:

5.1: For the four-layer DBN introduced in step (4), determine and optimize an optimal number of hidden layers in the DBN classifier by CSA.

5.2: Assume there are N groups crows in CSA, a position of a crow i after k iterative searches is given by $x_i^k$, and the crow i continues to try to search for the position $m_j^k$ where food is stored by the crow j. There are two possible scenarios for the CSA.

i) In one case, the crow j does not know that it is followed by the thief crow i; therefore, the thief crow i arrives to where the food is stored by the crow j, and the position of the thief crow i is updated as follows:

$$x_i^{k+1} = x_i^k + r_j \times fl_i^k (m_j^k - x_i^k) \quad (1)$$

wherein $r_j$ is a random number between 0 and 1, $fl_i^k$ is a parameter that controls the flying length.

ii) Another case is that the crow j knows that it is followed by the thief crow i; therefore, the crow j deceives the thief crow i, and transfers the thief crow i to another position in the search space, and the position of the thief crow i is updated by a random position.

The above two cases are summarized as follows:

$$x_i^{k+1} = \begin{cases} x_i^k + r_i \times fl_i^k (m_j^k - x_i^k), & r_i \geq AP \\ \text{random position, another situation} \end{cases} \quad (2)$$

Specifically, AP represents the perceived probability between [0, 1]. Unlike other optimization algorithms, there are two specific parameters in CSA: a parameter fl controlling flying length and a perceived probability AP. fl is used to determine a step size at which the crow moves to food storage. When a value of fl is between 0 and 1, the crow's new position will be between its current position and the potential food storage position. If the value of fl is larger than 1, the crow can access positions beyond the potential food storage position; the perceived probability AP provides a balance between diversification and intensification. The smaller the AP value is, the greater the intensification is; the larger the AP value is, the more the diversification is.

5.3: A process flow of the CSA comprises the following.

Step 1: Initialize the CSA, define optimization problems, decision variables and constraints; then, estimate the adjustable parameters of the CSA, including group size N, maximum number of iterations $iter_{max}$, flying length $fl_i^k$, perceived probability AP, and searching termination criteria.

Step 2: Initialize the position of the crow and the position of the food storage.

Step 3: Evaluate a fitness function, evaluating the position of the crow by calculating the fitness function, and all the crows are evenly distributed in a search space.

Step 4: Generate a new position of the crow according to equation (2).

Step 5: Check the feasibility of the new position of each crow. If the new position of the crow is feasible, the crow updates its position; otherwise, the crow stays at the current position and does not move to the generated new position.

Step 6: Evaluate the fitness function of the crow's new position, and calculate the fitness function value of each of the crow's new position.

Step 7: Evaluate the new position of all crows in the fitness function.

Step 8: Check the termination criteria, repeat steps 4 through 7 until the maximum number of iterations $iter_{max}$ is reached; when the termination criteria are met, determine the optimal position of the crow through the fitness function value as an solution to an optimized problem.

According to the above scheme, in the step 8, a fault diagnosis accuracy is regarded as an optimization target, and an error in the fault diagnosis is defined as the fitness function in the CSA-DBN classifier, thereby converting the problem of CSA optimizing DBN into the problem of optimizing minimum value of the fitness function.

According to the above solution, in the step (6), the learning process of the CSA-DBN fault diagnosis classifier mainly includes two steps, namely unsupervised training and supervised training.

Step 1: Initializing the entire network parameters. The learning process of the CSA-DBN fault diagnosis classifier is performed by layer-by-layer learning for each individual RBM. Using a greedy algorithm to perform unsupervised training on the RBMs layer by layer, and the outputs of the hidden layer in the lower RBM is used as the inputs of a visible layer of a upper RBM; when the RBM1 is completely trained, train the RBM2 and the RBM3 continuously.

Step 2: After pre-training the DBN layer-by-layer, fine tune all parameters (weights and deviations) of the pre-training model by the supervised backpropagation algorithm and distribute the error to each RBM from top to bottom by an inverse error propagation method. Adjust the initial parameters of each RBM to implement supervised training of the entire network; and update the parameters of the DBN model to obtain an optimal classifier (improving fault diagnosis accuracy).

Compared with the prior art, the beneficial effects of the present disclosure are the following.

This invention integrates the feature extraction algorithm EMD, the fault feature selection algorithm ELM, the deep learning optimization algorithm CSA and the fault identification algorithm DBN. Use EMD to extract fault feature vectors and use ELM to remove redundancy and interference features in the original fault feature data set. After the normalization process, the fault sensitive feature data set is sent to the CSA-DBN classifier. In the meantime, optimizing the deep learning algorithm can effectively avoid the shortcoming of neural network over-learning and falling into the local minimum value, thus improving the power electronic circuit fault identification accuracy.

BRIEF DESCRIPTION OF THE DRAWINGS

FIGS. 2A-2E is a schematic diagram of a five-level inverter circuit simulation topology according to an embodiment of the present disclosure.

DESCRIPTION OF THE EMBODIMENTS

The present disclosure will be further described below with reference to specific embodiments and the accompanying drawings.

Figure 1:
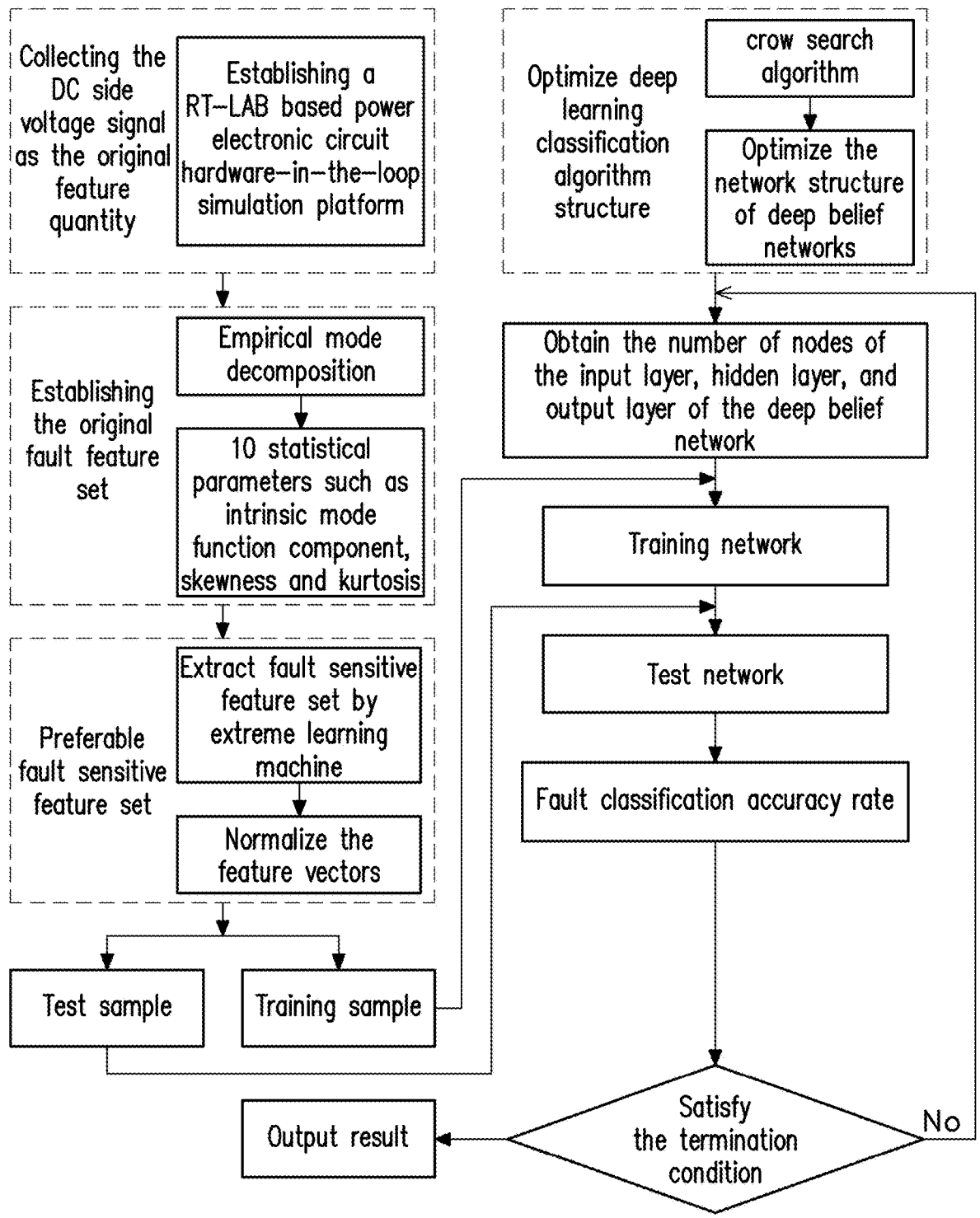
FIG. 1 is a flow chart of a power electronic circuit fault diagnosis method of the present disclosure.
Figure 3A:
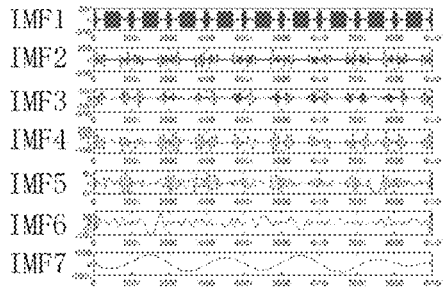
FIGS. 3A-3I are waveforms of a first 7-order IMF component corresponding to a five-level inverter fault according to an embodiment of the present disclosure.
Figure 3B:
Figure 3C:
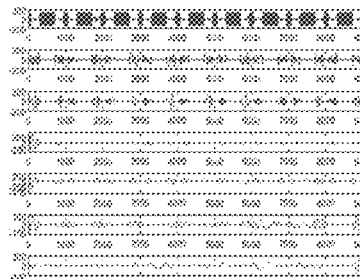
Figure 3D:
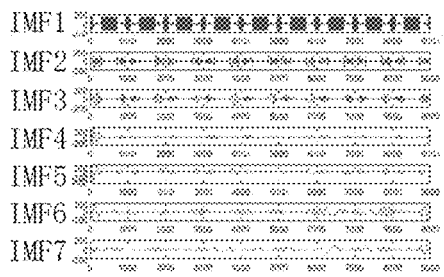
Figure 3E:
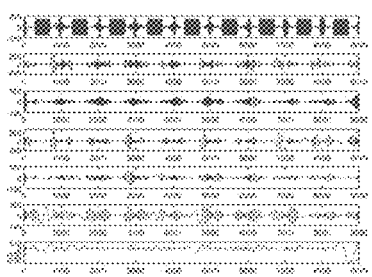
Figure 3F:
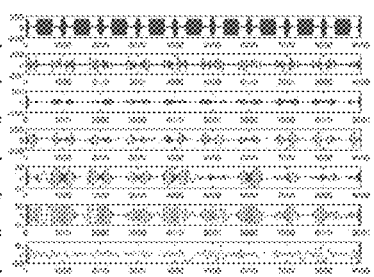
Figure 3G:
Figure 3H:
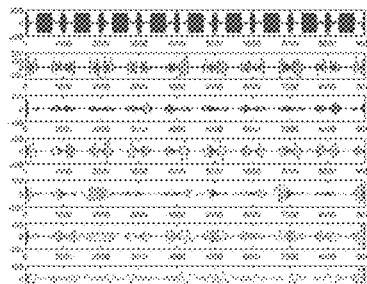
Figure 3I:
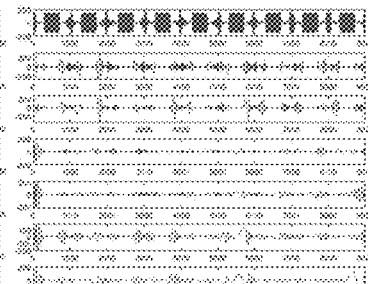

In the embodiment of the present disclosure, a five-level inverter is taken as an example, and a five-level inverter fault diagnosis method based on an optimized DBN, with reference to FIG. 1, includes the following steps.

(1) In order to verify the designed fault diagnosis method, non-real-time offline simulation is a common method, but a major shortcoming of this method is that there are many uncertain factors between offline simulation and actual prototype process. To make the fault diagnosis algorithm more practical, the fault experiment is carried out on the actual prototype using the RT-LAB hardware-in-the-loop simulator. The RT-LAB hardware-in-the-loop simulator is an industrial-level system real-time simulator introduced by Opal-RT Technologies of Canada. The dynamic system mathematical model established through MATLAB/Simulink can be directly applied to real-time simulation, control and testing. Different power electronic circuits can be simulated in RTLAB platform to perform fault experiments and obtain fault data.

Signal acquisition of the embodiment. The RT-LAB hardware-in-the-loop simulator is used to establish different fault experiments of the five-level inverter circuit. The topology diagram of the five-level inverter is shown in FIG. 2A. The output voltage corresponding to normal and faults of $S_{11}$, $S_{12}$, $S_{13}$ and $S_{21}$ are shown in FIGS. 2B-2E. According to the actual operation of a single power transistors open circuit fault classification, the fault classification algorithm can include a deep Boltzmann machine, a DBN and a sparse self-coding, etc. The DC-link output voltage is selected as the fault feature data, which is divided into 9 fault types (normal, $S_{11}$, $S_{12}$, $S_{13}$, $S_{14}$, $S_{21}$, $S_{22}$, $S_{23}$, $S_{24}$ open circuit fault). The five-level inverter fault type, fault label and fault code are shown in Table 1.

TABLE 1 type of faults and label

| Fault type | Fault label | Fault code |
|---|---|---|
| Normal | $[1, 0, 0, 0, 0, 0, 0, 0, 0]^T$ | 0 |
| $S_{11}$ open circuit fault | $[0, 1, 0, 0, 0, 0, 0, 0, 0]^T$ | 1 |
| $S_{12}$ open circuit fault | $[0, 0, 1, 0, 0, 0, 0, 0, 0]^T$ | 2 |
| $S_{13}$ open circuit fault | $[0, 0, 0, 1, 0, 0, 0, 0, 0]^T$ | 3 |
| $S_{14}$ open circuit fault | $[0, 0, 0, 0, 1, 0, 0, 0, 0]^T$ | 4 |
| $S_{21}$ open circuit fault | $[0, 0, 0, 0, 0, 1, 0, 0, 0]^T$ | 5 |
| $S_{22}$ open circuit fault | $[0, 0, 0, 0, 0, 0, 1, 0, 0]^T$ | 6 |
| $S_{23}$ open circuit fault | $[0, 0, 0, 0, 0, 0, 0, 1, 0]^T$ | 7 |
| $S_{24}$ open circuit fault | $[0, 0, 0, 0, 0, 0, 0, 0, 1]^T$ | 8 |

Figure 4:
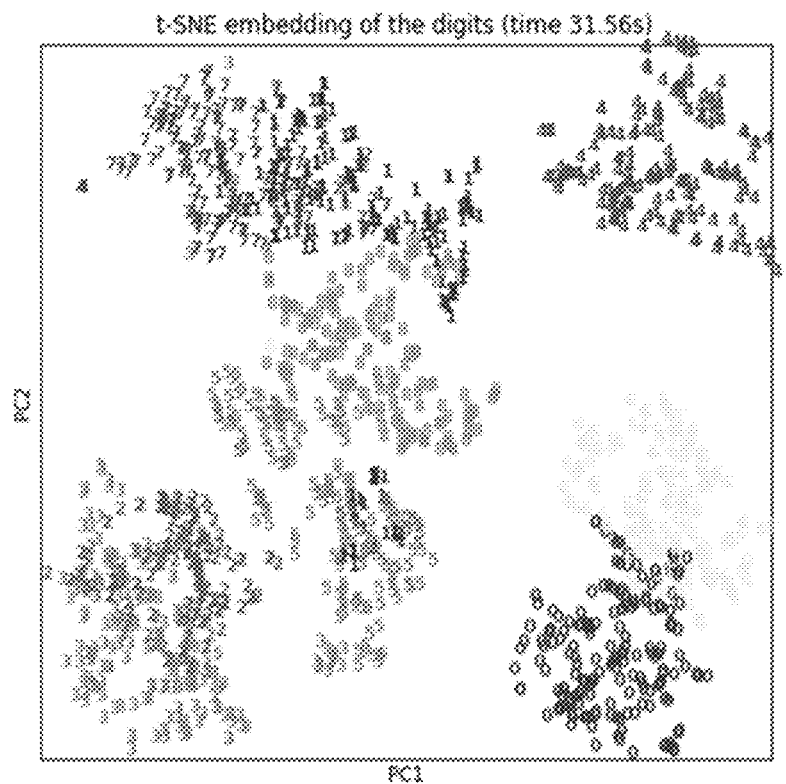
FIG. 4 is a visualization diagram of an original fault feature data set A corresponding to a five-level inverter according to an embodiment of the present disclosure.

(2) Constructing the original fault feature data set. The present disclosure focuses on analyzing the fault features generated by the open circuit of the power electronic device. Nine types of single power transistors open circuit fault (including normal condition) are set in total. Sixty groups DC-link output voltage signal are extracted from each fault type. There are total of 9*60=540 DC-link output voltage signal samples. Then, the EMD is performed on the output voltage signals of each fault type. The waveforms of the first 7-order IMF components corresponding to each fault type are respectively shown in FIGS. 3A-3I. Table 2 lists 10 statistical features of voltage signal, namely the first 7-order of IMF components, energy entropy of the IMF component, mean, standard deviation, skewness, kurtosis, wave index, margin index, peak index, amplitude, etc. There are 7*10=70 fault features in total. The original fault feature data set is established and defined as A, which the size of A is (540*70). The original fault feature data set A is visualized by two-dimensional visualization using the t-SNE method as shown in FIG. 4.

TABLE 2

10 statistical features

| No. | Feature | Calculation equation |
|---|---|---|
| 1 | Energy feature of IMF components | $T_1 = \sum_{i=1}^{n} \|sp(k)\|^2$ |
| 2 | Energy entropy of IMF component | $T_2 = -\sum_{i=1}^{n} P_i \log P_i, \ P_i = \frac{\|x_i\|^2}{Energy}$ |
| 3 | Mean | $T_3 = \frac{1}{n}\sum_{i=1}^{n} x_i$ |
| 4 | Standard deviation | $T_4 = \sqrt{\frac{1}{n}\sum_{i=1}^{n} \|x_i - T_3\|^2}$ |
| 5 | Skewness | $T_5 = [1/(n-1)]\sum_{i=1}^{n} \|x_i - T_3\|^3 / T_4$ |
| 6 | Kurtosis | $T_6 = [1/(n-1)]\sum_{i=1}^{n} \|x_i - T_3\|^4 / (T_4^4 - 3)$ |
| 7 | Wave index | $T_7 = \sqrt{(1/n)\sum_{i=1}^{n} \|x_i\|^2} / (1/n)\sum_{i=1}^{n} \|x_i\|$ |
| 8 | Margin indicator | $T_8 = \max[\|x_i\|] / \sqrt{(1/n)\sum_{i=1}^{n} \|x_i\|}$ |
| 9 | Peak indicator | $T_9 = \max[\|x_i\|] / \left[(1/n)\sum_{i=1}^{n} \|x_i\|\right]^2$ |
| 10 | Amplitude | $T_{10} = \max(\|x_i\|) - \min(\|x_i\|)$ |

Wherein, $x_i$ is the IMF components.

Figure 5:
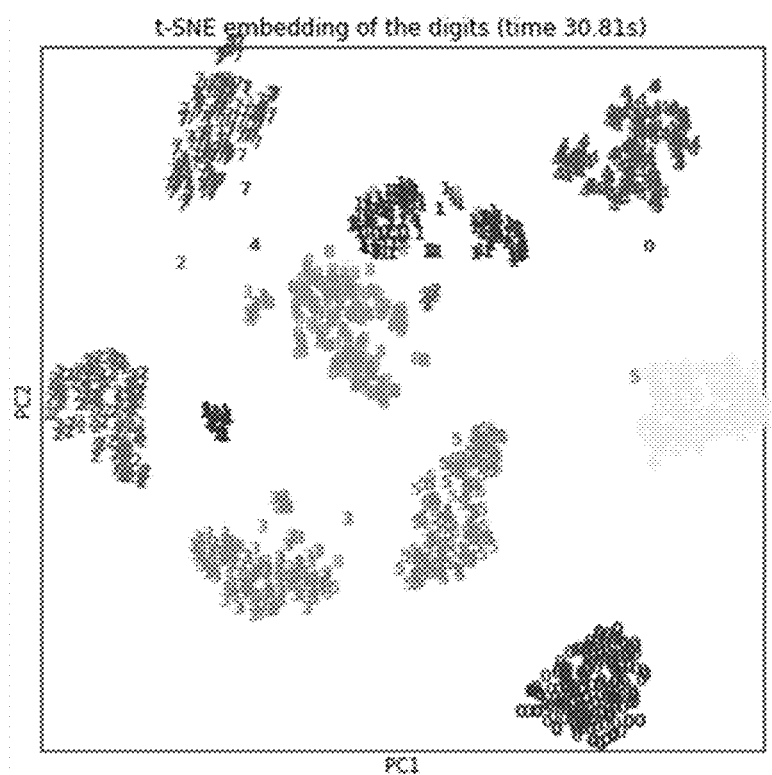
FIG. 5 is a visualization diagram of a fault sensitive feature data set B corresponding to a five-level inverter according to an embodiment of the present disclosure.

(3) Selecting the fault sensitive feature data set. In order to effectively select the sensitive fault features to perform fault identification, the ELM method is used for fault feature selection. The top 30 fault feature signal sequences with the highest weights in all sequences are defined as fault sensitive feature data set (which serves as the fault sensitivity index, it can better describe the fault characteristics and facilitate the fault classification), and defined as B with a size of (540*30). The t-SNE method is used to visualize the original fault feature data set B in two-dimensional, as shown in FIG. 5. It can be seen that after the ELM feature selection, the distance between different fault types are increased, thereby improving the resolution of the fault feature.

The specific method of step (3) is as follows.

(3.1) Using ELM feature selection method, take the top 30 fault features signal sequences with the highest sensitivity among 70 fault features signal sequences in the first 7-order in a descending order. A data set B (540*30) is obtained. Some of the 30 statistical features, i.e., fault sensitivity indexes, are as shown in Table 3.

TABLE 3

Partial data of 30 fault sensitivity indexes for five-level inverters

| Fault status | No. | 1-energy (1) | 1-Skewness (2) | 1-Peak index (3) | ... | 7-Pulse index (28) | 7-Standard deviation (29) | 7-Peak index (30) |
|---|---|---|---|---|---|---|---|---|
| N | 1 | 0.11986 | −0.24015 | 2.6159 | ... | 251.300 | 10.739 | 4.8071 |
|  | ... | ... | ... | ... | ... | ... | ... | ... |
|  | 30 | 0.11847 | −0.23587 | 2.6543 | ... | 213.52 | 7.8044 | 4.1139 |
| F1 | 31 | 0.45335 | −0.15778 | 3.4558 | ... | −444.19 | 7.1376 | 5.0669 |
|  | ... | ... | ... | ... | ... | ... | ... | ... |
|  | 60 | 0.4458 | −0.1664 | 3.6712 | ... | −809.18 | 58.095 | 4.3618 |
| F2 | 61 | 0.35036 | −0.1456 | 8.4457 | ... | 14.469 | 49.145 | 2.0167 |
|  | ... | ... | ... | ... | ... | ... | ... | ... |
|  | 90 | 0.35119 | −0.14623 | 8.5305 | ... | 5.8384 | 486.28 | 1.7438 |
| F3 | 91 | 0.46963 | −0.15598 | 3.5695 | ... | 129.84 | 302.26 | 3.4952 |
|  | ... | ... | ... | ... | ... | ... | ... | ... |
|  | 120 | 0.45665 | −0.16205 | 3.5346 | ... | 80.595 | 39.043 | 4.7394 |
| F4 | 121 | 0.2863 | −0.18469 | 4.6924 | ... | 31.406 | 69.107 | 4.1534 |
|  | ... | ... | ... | ... | ... | ... | ... | ... |
|  | 150 | 0.28162 | −0.16591 | 4.6881 | ... | −233.45 | 32.377 | 6.5833 |
| F5 | 151 | 0.3022 | −0.169 | 4.6721 | ... | 721.52 | 32.190 | 4.7301 |
|  | ... | ... | ... | ... | ... | ... | ... | ... |
|  | 180 | 0.29847 | −0.1661 | 4.6471 | ... | −75.428 | 38.102 | 7.2924 |
| F6 | 181 | 0.29306 | −0.1963 | 4.821 | ... | 124.96 | 50.254 | 6.1893 |
|  | ... | ... | ... | ... | ... | ... | ... | ... |
|  | 210 | 0.28948 | −0.18509 | 4.5697 | ... | −244.86 | 21.628 | 8.0939 |
| F7 | 211 | 0.19112 | −0.13138 | 5.1566 | ... | −308.98 | 29.057 | 6.1744 |
|  | ... | ... | ... | ... | ... | ... | ... | ... |
|  | 240 | 0.18783 | −0.13975 | 5.9524 | ... | −391.64 | 8357.7 | 4.7928 |
| F8 | 241 | 0.10276 | −0.56054 | 6.2177 | ... | 5990.1 | 8363.1 | 7.1159 |
|  | ... | ... | ... | ... | ... | ... | ... | ... |
|  | 270 | 0.11617 | −0.54752 | 6.9887 | ... | 449.68 | 8428.9 | 5.6961 |

In table 3, 1-energy represents the energy feature of the first-order IMF component, and so forth. The 7-peak index represents the peak index of the 7th-order IMF component. N represents no fault, and F represents that fault is found in a single power transistor open circuit. F1, F2, F3, F4, F5, F6, F7, F8 represent that power transistors $S_{11}$, $S_{12}$, $S_{13}$, $S_{14}$, $S_{21}$, $S_{22}$, $S_{23}$, $S_{24}$ open circuit fault, respectively.

(3.2) Normalize the data obtained as described above. The main function of data normalization is to eliminate the dimensional relationship between variables and make the data comparable.

(4) Divide the fault sensitive feature data set into training samples and test samples, and primitively determine the structure of DBN. The specific methods are as follows:

The fault sensitive feature set is divided into training samples and test samples. The DBN consists several RBMs. The first layer and the second layer (input layer and hidden layer 1) of DBN are the visible layer and the hidden layer of the RBM1, respectively. It should be noted that the first layer of the DBN is generally considered to be the data input layer, and the second layer of the DBN (hidden layer 1) and third layer of the DBN (hidden layer 2) form the visible layer and the hidden layer of the RBM2, respectively. The third layer of the DBN and the fourth layer of the DBN (hidden layers 2 and 3) constitute the visible layer and hidden layer of the RBM3.

(5) Structural optimization of deep learning classifier. The number of hidden neurons in the DBN model has plays a more important role than the other factors of the learning algorithm. Therefore, in order to obtain a better deep learning classifier structure to provide an effective strategy in selecting the number of the hidden layer, the CSA is used to optimize the DBN network structure, determine the number of neurons in the first and second hidden layers on the training sample, and set the number of nodes of the input layer, hidden layer and output layer of the network.

CSA is an evolutionary computation technique based on the behavior of crows. Compared with other optimization algorithms, CSA has stronger global search ability and faster convergence speed. The algorithm assumes that crow's intelligent behavior can hide excessive food in specific locations and find hidden places when necessary. On the other hand, crows may be greedy because they follow other crows and steal food at the food storage after the owner leaves. Therefore, crows take additional measures to prevent their food from being stolen. CSA attempts to imitate this intelligent behavior and provides an effective way to solve optimization problems.

Figure 6:
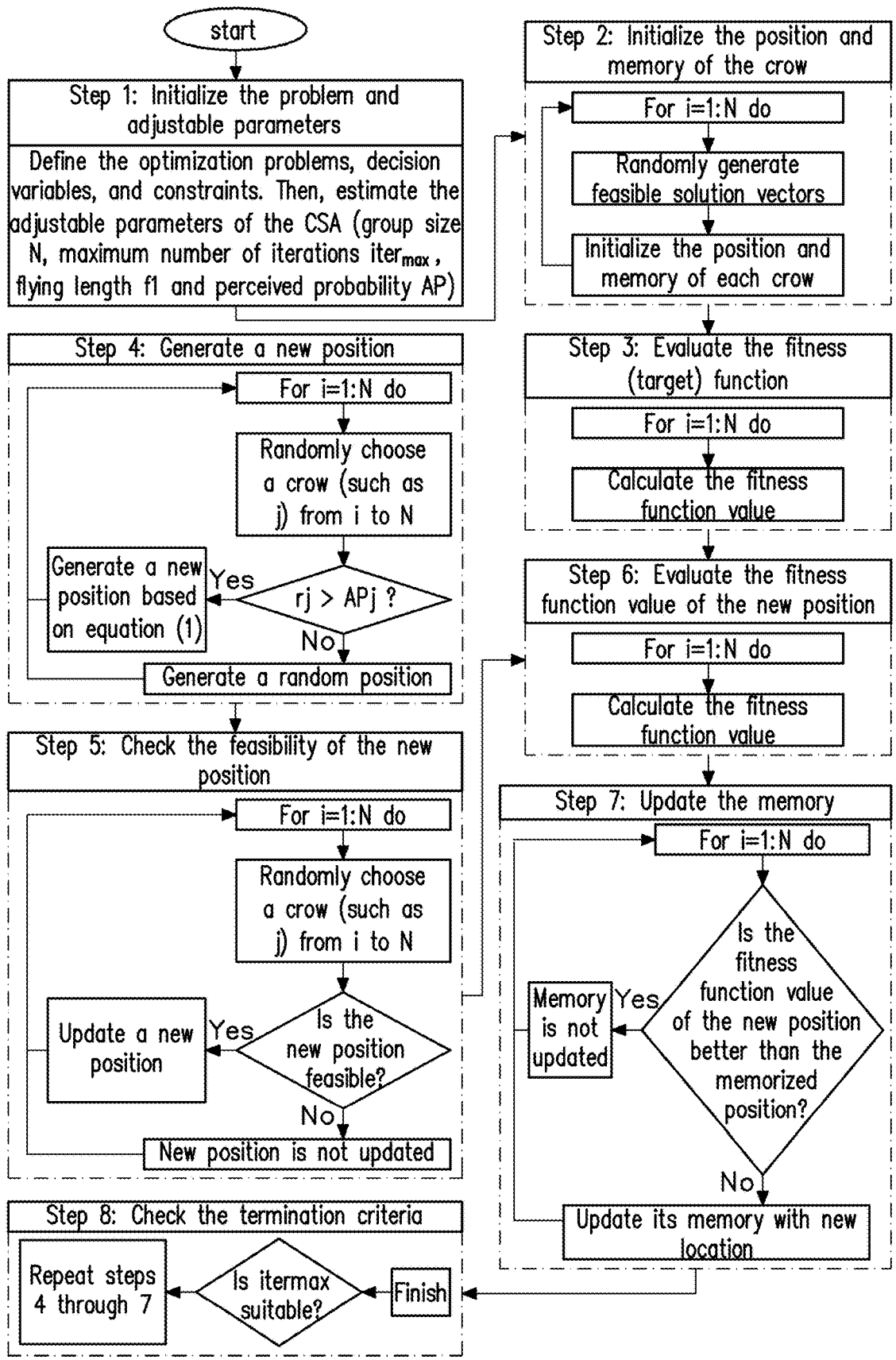
FIG. 6 is a flow chart of CSA according to an embodiment of the present disclosure.

Please refer to FIG. 6 for the step flow of the CSA of step (5), and the algorithm specifically includes the following steps.

Step 1: Initialize of the CSA, defining optimization problems, decision variables and constraints; then, estimate the adjustable parameters of the CSA, including group size N, maximum number of iterations $iter_{max}$, flying length $fl_i^k$, perceived probability AP, and search termination criteria.

Step 2: Initialize the position of the crow and the position of the food storage.

Step 3: Evaluate a fitness function, evaluate the position of the crow by calculating the fitness function, and all the crows are evenly distributed in a search space.

Step 4: Generate a new position of the crow according to equation (2).

Step 5: Check a feasibility of the new position of each crow, if the new position of the crow is feasible, the crow updates its position; otherwise, the crow stays at the current position and does not move to the new position generated.

Step 6: Evaluate the fitness function of crow's new position, and calculate the fitness function value of each crow's new position.

Step 7: Evaluate the new positions of all crows in the fitness function.

Step 8: Check the termination criteria, repeat steps 4 through 7 until the maximum number of iterations $iter_{max}$ is reached; when the termination criteria are met, determine the optimal position of the crow through the fitness function value as a solution to the optimization problem; the fault diagnosis rate is generally considered as the optimization target, define the error of the fault diagnosis as the fitness function in the CSA-DBN classifier, and convert the structural problem of the CSA optimization DBN into the optimization problem of the minimum value of the fitness function.

(6) Use CSA-DBN fault diagnosis classifier to complete the identification of fault sensitive feature data set, and realize fault diagnosis of power electronic circuit: use the advantages of deep learning in high-dimensional and non-linear signal processing, complete DBN-based adaptive analysis and fault intelligent identification on fault features, the learning process of CSA-DBN fault diagnosis classifier mainly includes unsupervised training and supervised training.

The specific method of step (6) is as follows.

(6.1) Fault classification of five-level inverter circuit, including the following. Step 1: initialize the entire network parameters, divide the fault samples into train samples and test samples, and primitively determine the four-layer DBN including the input layer and the output layer, and determine the optimal number of hidden layers in the DBN classifier by using the CSA. In this embodiment, the present disclosure defines the error classification as the fitness function in the CSA-DBN fault diagnosis classifier, thus converting this problem into solving the minimum optimization problem. Step 2: use the CSA-DBN fault diagnosis classifier to verify the test samples. There are 100 test samples corresponding to each fault type, and there are 900 test samples in total. Step 3: calculate the classification accuracy and provide fault diagnosis result.

Figure 7A:
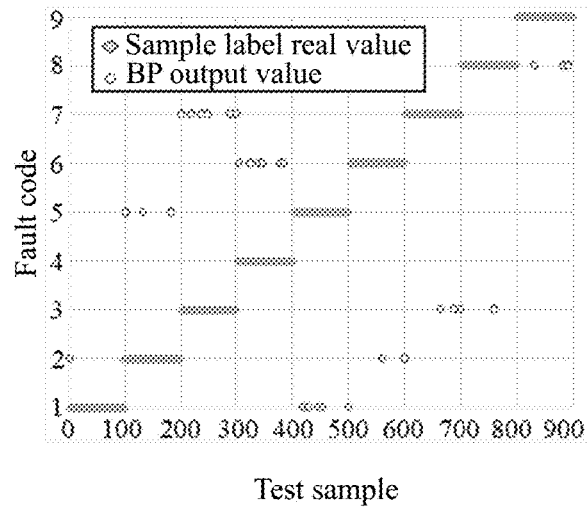
FIGS. 7A-7C are comparisons of fault diagnosis results based on three methods, namely BP, SVM and CSA-DBN, according to an embodiment of the present disclosure.
Figure 7B:
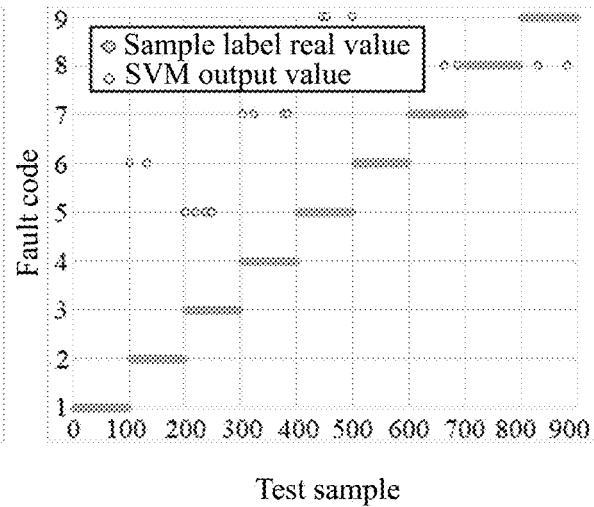
Figure 7C:
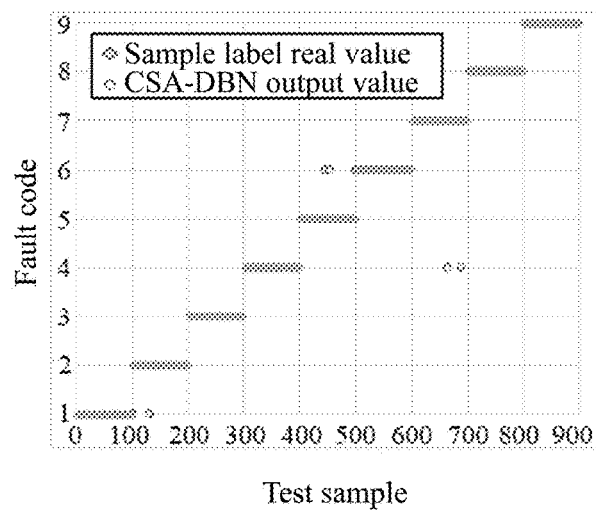

(6.2) The fault classification results of five-level inverter circuit are shown in Table 4, which is compared with the fault classification results of back propagation neural network (BPNN) and support vector machine (SVM). FIGS. 7A-7C are respectively comparisons of fault diagnosis results based on BPNN, SVM and CSA-DBN according to an embodiment of the present disclosure. It can be seen that the diagnostic effect of CSA-DBN is the best, thus indicating the superiority of the method of the present disclosure in fault diagnosis of power electronic circuits.

normalized fault feature vector to the fault diagnosis classifier subjected to CSA-DBN, thereby improving the classification accuracy and fault tolerance of a single algorithm. In the meantime, the deep learning algorithm is used to effectively avoid the shortcomings of neural network over-learning and falling into local minimum value.

The present disclosure has been exemplified in detail with reference to the drawings, and various modifications and changes can be made by those skilled in the art, and therefore equivalent technical solutions also fall within the scope of the present disclosure. Also, substantial improvements adopting the concept and solution of present disclosure all fall within the scope of protection of the present disclosure. The details not described in the specification are existing technique known to those skilled in the art.

What is claimed is:

1. A power electronic circuit fault diagnosis method based on optimizing a deep belief network, comprising the following steps:
   (1) using MATLAB/Simulink to establish a circuit topology and a controller simulation model, and performing a real-time operation of the controller simulation model through a RT-LAB hardware-in-the-loop simulator to complete a system design; setting up a fault experiment and collect DC-link output voltage signal of power electronic circuits in different fault types as a raw data set; obtaining original fault feature by label classifying fault types according to numbers and positions of faulty power electronic devices;
   (2) performing empirical mode decomposition (EMD) on DC-link output voltage signal, obtaining an effective intrinsic mode function (IMF) component, and calculating statistical features to construct the original fault feature data set;
   (3) selecting a fault sensitive feature data set based on the feature selection method of extreme learning machine (ELM) by removing redundancy and interference features in the original fault feature data set and normalizing the original fault feature data set;
   (4) dividing the fault sensitive feature data set into training samples and test samples, and primitively determining the structure of the deep belief network (DBN);
   (5) using a crow search algorithm (CSA) to optimize the network structure of the DBN, determining number of neurons in first and second hidden layers on the training sample, and setting a nodes number of the input layer, the hidden layer and the output layer in DBN;
   (6) using a CSA-DBN fault diagnosis classifier to identify different fault type of the power electronic circuit test samples, calculating a classification accuracy, and providing the fault diagnosis result.

TABLE 4

Comparison of five-level inverter fault classification results

| Diagnostic circuit | Classification method | Classification accuracy rate corresponding to single switch open circuit fault | | | | | | | | |
|---|---|---|---|---|---|---|---|---|---|---|
| | | Normal | S11 | S12 | S13 | S14 | S21 | S22 | S23 | S24 |
| Five-level inverter | BPNN | 99% | 97% | 94% | 94% | 95% | 98% | 97% | 99% | 97% |
| | SVM | 100% | 98% | 96% | 96% | 97% | 100% | 98% | 100% | 100% |
| | CSA-DBM | 100% | 98% | 100% | 100% | 97% | 100% | 98% | 100% | 100% |

The disclosure extract and select the fault feature vector by using the EMD and ELM algorithm and sends the 2. The power electronic circuit fault diagnosis method based on optimizing the DBN according to claim 1, wherein setting the fault experiment by using the RT-LAB hardware-in-the-loop simulator in the step (1) comprises:
- developing a control strategy by connecting a digital signal processor (DSP) control platform to the RT-LAB hardware-in-the-loop simulator;
- setting different fault experiments by using the RT-LAB hardware-in-the-loop simulator; constructing a fault feature database containing multiple fault types, and recording the information of fault location, fault type, fault cause, fault effect, and a circuit system output voltage;
- collecting output voltage signal of the power electronic circuit, setting different fault types, and developing research on fault feature extraction, fault feature optimization and fault diagnosis algorithms.

3. The power electronic circuit fault diagnosis method based on optimizing the DBN according to claim 1, wherein obtaining the original fault feature by EMD in the step (2) comprises:
- performing the EMD on the output voltage signal of each fault types;
- obtaining effective first 7-order of IMF components; and
- calculating signal sequences of 10 statistical features for the each order IMF components, comprising: IMF component, energy entropy of the IMF component, mean, standard deviation, skewness, kurtosis, wave index, margin index, peak index and amplitude; in each of the fault type, the original fault feature set are the corresponding first 7-order IMF components of the signals having 70 statistical feature parameters in total, as the original fault feature data set.

4. The power electronic circuit fault diagnosis method based on optimizing the DBN according to claim 3, wherein the step (3) comprises:
- filtering the data of the original fault feature data set based on ELM feature selection method;
- reducing a dimension of the fault feature; and
- taking top 30 fault feature signal sequences with a highest weight among all fault feature signal sequences, as the fault sensitive feature data set.

5. The power electronic circuit fault diagnosis method based on optimizing the DBN according to claim 4, wherein the specific method of the step (4) comprises:
- dividing the fault sensitive feature data set into training samples and test samples;
- introducing a 4-layer DBN, wherein the DBN consists of 3 deep Boltzmann machines (RBMs), a first layer of the DBN is a visible layer of a RBM1, and a second layer of the DBN is a hidden layer of the RBM1; the first layer of the DBN is a data input layer, the second layer of DBN is a visible layer of a RBM2 and a third layer of DBN is a hidden layer of the RBM2, and the third layer of the DBN is a visible layer of a RBM3 and a fourth layer of DBN is a hidden layer of the RBM3.

6. The power electronic circuit fault diagnosis method based on optimizing the DBN according to claim 5, wherein the step (5) comprises:
- 5.1: for the four-layer DBN introduced in step (4), determining and optimizing an optimal number of hidden layers in the DBN classifier by the CSA;
- 5.2: assuming there are N groups of crows in CSA, a position of a crow i after k iterative searches is given by $x_i^k$, and the crow i continues to try to search for a position $m_j^k$ where food is stored by a crow j, there are two possible scenarios for the CSA:
  - i) in one case, the crow j does not know that it is followed by a thief crow i; therefore, the thief crow i arrives to where the food is stored by the crow j, and the position of the thief crow i is updated as follows:

$$x_i^{k+1} = x_i^k + r_i \times fl_i^k (m_j^k - x_i^k) \quad (1)$$

wherein $r_i$ is a random number between 0 and 1, $fl_i^k$ is a parameter that controls a flying length;
  - ii) another case is that the crow j knows that it is followed by the thief crow i; therefore, the crow j deceives the thief crow i, and transfers the thief crow i to another position in the search space, and the position of the thief crow i is updated by a random position;

the above two cases are summarized as follows:

$$x_i^{k+1} = \begin{cases} x_i^k + r_i \times fl_i^k (m_j^k - x_i^k), & r_i \geq AP \\ \text{random position, another situation} \end{cases} \quad (2)$$

(2)
wherein AP represents the perceived probability between [0, 1]; unlike other optimization algorithms, there are two specific parameters in CSA: a parameter fl controlling flying length and a perceived probability AP, the parameter fl is used to determine a step size at which the crow moves to the food storage, wherein when a value of fl is between 0 and 1, the crow's new position is between its current position and a potential food storage position, wherein when the value of fl is larger than 1, the crow can access positions beyond the potential food storage position; the perceived probability AP provides a balance between diversification and intensification, the smaller the AP value is, the greater the intensification is; the larger the AP value is, the more the diversification is;

5.3: a process flow of the CSA comprises the following:
Step 1: initializing the CSA, defining optimization problems, decision variables and constraints; then, estimating adjustable parameters of the CSA, including group size N, maximum number of iterations $iter_{max}$, flying length $fl_i^k$, perceived probability AP, and searching termination criteria;
Step 2: initializing the position of the crow and the position of the food storage;
Step 3: evaluating a fitness function, evaluating the position of the crow by calculating the fitness function, and all the crows are evenly distributed in a search space;
Step 4: generating a new position of the crow according to equation (2);
Step 5: checking a feasibility of the new position of each crow, if the new position of the crow is feasible, the crow updates its position; otherwise, the crow stays at the current position and does not move to the generated new position;
Step 6: evaluating the fitness function of the crow's new position, and calculate the fitness function value of each of the crow's new position;
Step 7: evaluating the new position of all crows in the fitness function;
Step 8: checking the termination criteria, repeating steps 4 through 7 until the maximum number of iterations $iter_{max}$ is reached; when the termination criteria are met, determining the optimal position of the crow through the fitness function value as a solution to an optimized problem.

7. The power electronic circuit fault diagnosis method based on optimizing the DBN according to claim 6, wherein in the step 8, a fault diagnosis accuracy is regarded as an optimization target, and an error in the fault diagnosis is defined as the fitness function in the CSA-DBN classifier, thereby converting the problem of CSA optimizing DBN into the problem of optimizing minimum value of the fitness function.

8. The power electronic circuit fault diagnosis method based on optimizing the DBN according to claim 7, wherein in the step (6), a learning process of the CSA-DBN fault diagnosis classifier comprises two steps, unsupervised training and supervised training:

Step 1: initializing the entire network parameters, wherein the learning process of the CSA-DBN fault diagnosis classifier is performed by layer-by-layer learning for each individual RBM by using a greedy algorithm to perform unsupervised training on the RBMs layer by layer, and outputs of the hidden layer in the lower RBM is used as the inputs of a visible layer of a upper RBM; when the RBM1 is completely trained, train the RBM2 and the RBM3 continuously;

Step 2: after pre-training the DBN layer-by-layer, fine tuning all parameters of the pre-training model by the supervised backpropagation algorithm and distributing the error to each RBM from top to bottom by an inverse error propagation method, adjusting initial parameters of each RBM to implement the supervised training of the entire network; and updating the parameters of the DBN model to obtain an optimal classifier.

* * * * *